United States Patent
Chu et al.

(10) Patent No.: US 10,651,306 B2
(45) Date of Patent: May 12, 2020

(54) DIGITAL ALLOY BASED BACK BARRIER FOR P-CHANNEL NITRIDE TRANSISTORS

(71) Applicant: HRL Laboratories, LLC, Malibu, CA (US)

(72) Inventors: Rongming Chu, Newbury Park, CA (US); Yu Cao, Agoura Hills, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/687,369

(22) Filed: Aug. 25, 2017

(65) Prior Publication Data
US 2019/0067464 A1    Feb. 28, 2019

(51) Int. Cl.
| | | |
|---|---|---|
| H01L 29/778 | (2006.01) | |
| H01L 29/15 | (2006.01) | |
| H01L 29/205 | (2006.01) | |
| H01L 29/66 | (2006.01) | |
| H01L 29/20 | (2006.01) | |
| H01L 29/207 | (2006.01) | |
| H01L 29/423 | (2006.01) | |

(52) U.S. Cl.
CPC ........ *H01L 29/7785* (2013.01); *H01L 29/155* (2013.01); *H01L 29/205* (2013.01); *H01L 29/66462* (2013.01); *H01L 29/7781* (2013.01); *H01L 29/2003* (2013.01); *H01L 29/207* (2013.01); *H01L 29/4236* (2013.01)

(58) Field of Classification Search
CPC ........... H01L 29/7785; H01L 29/66462; H01L 29/7781; H01L 29/205; H01L 29/155; H01L 29/4236; H01L 29/207; H01L 29/2003
See application file for complete search history.

(56) References Cited

U.S. PATENT DOCUMENTS

| | | | |
|---|---|---|---|
| 8,648,389 B2 | 2/2014 | Makabe | |
| 9,202,905 B1 | 12/2015 | Xie | |
| 9,559,012 B1* | 1/2017 | Chu | .............. H01L 29/2003 |
| 9,812,532 B1* | 11/2017 | Chu | .............. H01L 29/2003 |
| 2006/0108606 A1* | 5/2006 | Saxler | .............. H01L 21/318 |
| | | | 257/200 |

(Continued)

OTHER PUBLICATIONS

PCT International Search Report and Written Opinion from PCT/US2017/048753 dated Feb. 28, 2018.
"GaN/AlGaN P-Channel Inverted Heterostructure JFET," Shatalov, M. et al., Aug. 2002, IEEE Electron Device Letters, vol. 23, No. 8, pp. 452-454.

(Continued)

*Primary Examiner* — Bac H Au
(74) *Attorney, Agent, or Firm* — Ladas & Parry

(57) ABSTRACT

A III-nitride power handling device and the process of making the III-nitride power handling device are disclosed that use digital alloys as back barrier layer to mitigate the strain due to lattice mismatch between the channel layer and the back barrier layer and to provide increased channel conductivity. An embodiment discloses a GaN transistor using a superlattice binary digital alloy as back barrier comprising alternative layers of AlN and GaN. Other embodiments include using superlattice structures with layers of GaN and AlGaN as well as structures using AlGaN/AlGaN stackups that have different Aluminum concentrations. The disclosed device has substantially increased channel conductivity compared to traditional analog alloy back barrier devices.

15 Claims, 8 Drawing Sheets

(56) References Cited

U.S. PATENT DOCUMENTS

| | | | |
|---|---|---|---|
| 2006/0244010 A1* | 11/2006 | Saxler | H01L 29/7783 257/194 |
| 2006/0255364 A1 | 11/2006 | Saxler | |
| 2007/0164315 A1 | 7/2007 | Smith | |
| 2009/0072272 A1* | 3/2009 | Suh | H01L 29/1066 257/194 |
| 2010/0032718 A1* | 2/2010 | Yu | H01L 33/04 257/200 |
| 2011/0057232 A1 | 3/2011 | Sheppard | |
| 2014/0264371 A1* | 9/2014 | Debray | H01L 33/32 257/76 |
| 2015/0287785 A1 | 10/2015 | Mishra | |
| 2017/0069717 A1* | 3/2017 | Linthicum | H01L 29/1054 |

OTHER PUBLICATIONS

"P-Channel InGaN HFET Structure Based on Polarization Doping," Zimmermann, T. et al., Jul. 2004, IEEE Electron Device Letters, vol. 25, No. 7, pp. 450-452.

"Polarization-Induced GaN-on-Insulator E/D Mode p-Channel Heterostructure FETs," Li, G. et al., Jul. 2013, IEEE Electron Device Letters, vol. 34, No. 7, pp. 852-854.

"p-Channel Enhancement and Depletion Mode GaN-based HFETs with Quaternary Backbarriers," Hahn et al., Oct. 2013, IEEE Transaction on Electron Devices, vol. 60, No. 10, pp. 3005-3011.

"AlGaN/AIN/GaN High-Power Microwave HEMT," L. Shen et al., Oct. 2001, IEEE Electron Device Letters, vol. 22, pp. 457-459.

International Preliminary Report on Patentability (Chapter II of the Patent Cooperation Treaty) from PCT/US2017/048753, dated Oct. 7, 2019.

* cited by examiner

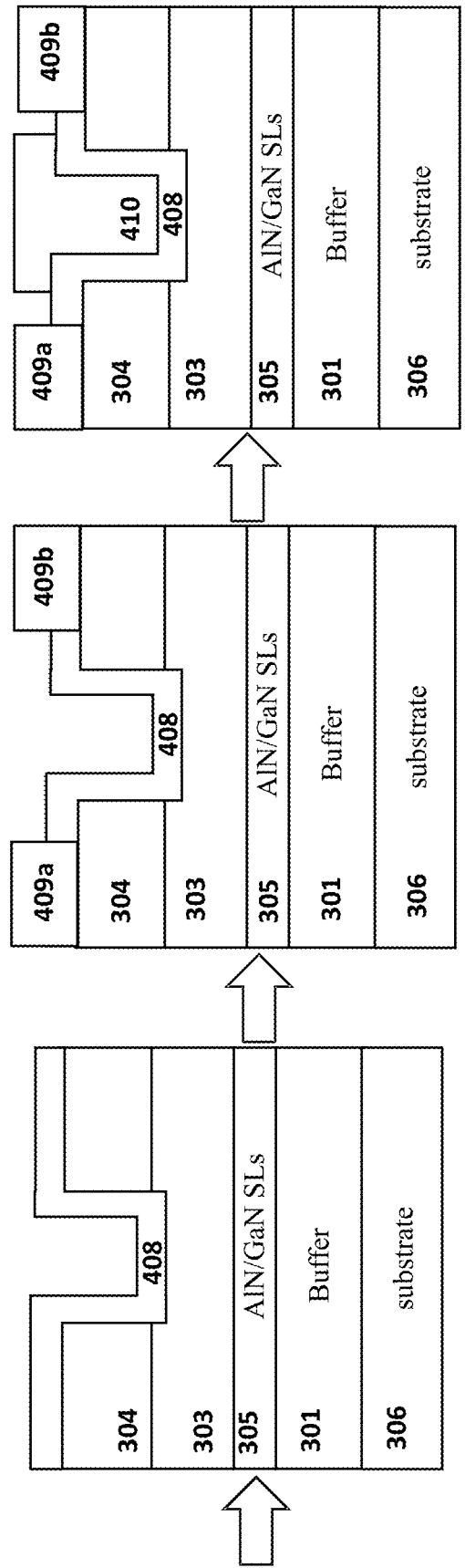

DIGITAL ALLOY BASED BACK BARRIER FOR P-CHANNEL NITRIDE TRANSISTORS

TECHNICAL FIELD

The present disclosure is directed in general to the area of III-Nitride transistors and in particular to the design and fabrication of P-Channel GaN Transistors.

BACKGROUND OF THE DISCLOSURE

GaN power integrated circuits (IC) have the potential of dramatically reducing the size and weight of power electronic systems, thereby substantially reducing the cost of power electronic devices. P-channel GaN-transistor is a critical component for making GaN power ICs. Such power electronic systems are widely needed in electric/hybrid vehicles, more-electric aircrafts, as well as many consumer electronic products.

A variety of GaN transistors are known and they include P-Channel transistors in conjunction with N-Channel transistors using an analog alloy to improve conductivity. The use of a tertiary alloy such as AlGaN (Aluminum-Gallium-Nitride) is often referred to as analog alloy in the art. To increase power handling capacity of GaN transistors, several techniques have been exploited to increase channel conductivity.

It is important to achieve low channel resistance so that the total power consumption can be reduced as well as the device speed can be improved. Increasing the carrier density is one common option that is exploited often. This can be achieved by using high Aluminum (Al) compositions such as AlGaN as back barrier beneath the GaN channel. Higher the aluminum content, higher is the channel conductivity. However thick analog AlGaN with high Al content cannot be grown on GaN buffer due to the lattice mismatch. This is a fundamental limit of using analog AlGaN alloys as the back-barrier.

The proposed technology overcomes this limitation by proposing a new way to increase channel conductivity while managing the stress related to lattice mismatch.

SUMMARY OF THE DISCLOSURE

To address one or more of the above-deficiencies of the prior art, one embodiment described in this disclosure provides for a power handling device comprising, a III-nitride channel layer, a III-nitride cap layer on the channel layer, where the cap layer has higher level of p-type doping than the channel layer, and a III-nitride digital alloy back barrier below the channel layer comprising a superlattice or superlattice structure. According to an embodiment of the present disclosure, a superlattice is a layer consisting of at least three alternating layers of a material A and a material B; each layer of material A and each layer of material B having a thickness of less than 10 nanometer.

Another embodiment described in this disclosure provides for a process of making a power handling device comprising the steps of depositing a buffer layer on a substrate, depositing a digital alloy back barrier layer on the buffer layer, depositing a III-nitride channel on the digital alloy layer, depositing a III-nitride p-doped cap layer on the channel layer, etching a gate recess in the cap layer exposing the channel layer, depositing a gate dielectric inside the gate recess and depositing a gate metal inside the gate recess and on the gate dielectric wherein, the digital alloy layer is made up of superlattice structure.

An embodiment of this disclosure comprises a power handling device having: a III-nitride channel layer, a III-nitride cap layer on the channel layer, where the cap layer has higher level of p-type doping than the channel layer, and a III-nitride digital alloy back barrier below the channel layer; the III-nitride digital alloy back barrier comprising a superlattice structure.

According to an embodiment of this disclosure, the power handling device further comprises a buffer layer below the digital alloy back barrier layer.

According to an embodiment of this disclosure, the III-nitride channel layer is a Gallium Nitride (GaN) channel layer.

According to an embodiment of this disclosure, the cap layer is a Magnesium (Mg) doped GaN.

According to an embodiment of this disclosure, the digital alloy back barrier is a binary alloy.

According to an embodiment of this disclosure, the superlattice structure comprises alternating Aluminum Nitride (AlN) and GaN layers.

According to an embodiment of this disclosure, the superlattice structure comprises ternary alloys.

According to an embodiment of this disclosure, the superlattice structure comprises alternating GaN and Aluminum-Gallium-Nitride (AlGaN) layers.

According to an embodiment of this disclosure, the superlattice structure comprises alternating AlGaN and AlGaN layers with different Aluminum percentages.

According to an embodiment of this disclosure, the digital alloy is designed to mitigate strain due to lattice mismatch between the channel layer and the digital alloy back barrier layer.

An embodiment of this disclosure also comprises a of making a power handling device comprising: depositing a buffer layer on a substrate; depositing a digital alloy back barrier layer on the buffer layer; depositing a III-nitride channel on the digital alloy layer; depositing a III-nitride p-doped cap layer on the channel layer; etching a gate recess in the cap layer exposing the channel layer; depositing a gate dielectric inside the gate recess; and depositing the gate metal inside the gate recess and on the gate dielectric, wherein the digital alloy layer is made up of superlattice structure.

According to an embodiment of this disclosure, the III-nitride channel is GaN and the cap layer is a Magnesium (Mg) doped GaN.

According to an embodiment of this disclosure, the digital alloy back barrier is a binary alloy.

According to an embodiment of this disclosure, the superlattice structure comprises alternating Aluminum Nitride (AlN) and GaN layers.

According to an embodiment of this disclosure, the superlattice structure comprises ternary alloys.

According to an embodiment of this disclosure, the superlattice structure comprises alternating GaN and Aluminum-Gallium-Nitride (AlGaN) layers.

According to an embodiment of this disclosure, the superlattice structure comprises alternating AlGaN and AlGaN layers with different Aluminum percentages.

According to an embodiment of this disclosure, the digital alloy is designed to mitigate the strain due to lattice mismatch between the channel layer and the digital alloy back barrier layer.

According to an embodiment of this disclosure, the digital alloy layer is between 1 micrometer and 2 micrometer thick.

An embodiment of this disclosure comprises a P-channel III-nitride transistor having: a III-nitride channel layer, and a III-nitride digital alloy back barrier below the channel layer; the III-nitride digital alloy back barrier comprising a superlattice structure.

Certain embodiments may provide various technical advantages depending on the implementation. For example, a technical advantage of some embodiments may include the use of binary digital alloy such as stacked up layers of Aluminum Nitride and Gallium Nitride. Other embodiments may use stack up of ternary digital alloys.

Although specific advantages have been enumerated above, various embodiments may include some, none, or all of the enumerated advantages. Additionally, other technical advantages may become readily apparent to one of ordinary skill in the art after review of the following figures and description.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIGS. 4a, 4b and 4c illustrate the next set of steps involved in the fabrication of a p-channel GaN transistor containing digital AlN—GaN super lattice alloys as the back barrier, according to an embodiment of the present disclosure;

FIG. 5a illustrates a p-channel GaN transistor structure according to an embodiment of the present disclosure;

FIG. 5b illustrates the channel conductivity characteristics for the p-channel GaN transistor structure illustrated in FIG. 5a;

FIG. 6b illustrates the channel conductivity characteristics for the p-channel GaN transistor structure illustrated in FIG. 6a;

DETAILED DESCRIPTION

It should be understood at the outset that, although example embodiments are illustrated below, the present technology may be implemented using any number of techniques, whether currently known or not. The present technology should in no way be limited to the example implementations, drawings, and techniques illustrated below. Additionally, the drawings are not necessarily drawn to scale.

Recently, GaN transistors have revolutionized high power and high speed switching electronics and there is a constant push, driven by the application demands, for higher and higher power handling capacities. GaN transistor's power handling capacity depends directly on the channel conductivity.

III-Nitride semiconductor materials (Aluminum, Indium, Gallium)Nitride are excellent wide band gap semiconductors very suitable for modern electronic and optoelectronic applications. Though this disclosure describes the technology using GaN, the proposed technology applies to any of the III-Nitride semiconductor materials.

Figure 1:
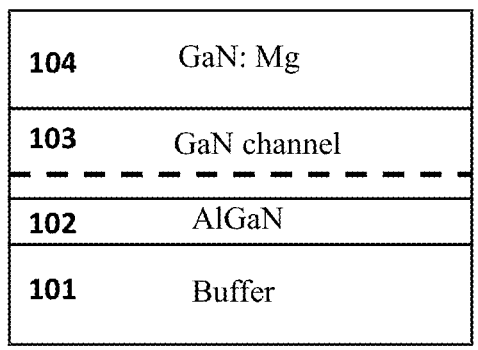
FIG. 1 illustrates a conventional p-channel GaN structure with analog AlGaN back barrier.

FIG. 1 illustrates a conventional p-channel GaN transistor structure. It contains a ternary alloy (102) Aluminum-Gallium Nitride (AlGaN), which is normally referred to as analog AlGaN, as the back barrier. This back barrier 102 is directly under the GaN channel 103 as the back barrier layer helps to improve the p-type carrier concentration in the GaN channel, utilizing the polarization effect introduced by the back barrier AlGaN layer 102. In other words, the higher conduction band_energy in the large bandgap AlGaN barrier layers improves the confinement of carriers in the low bandgap GaN channel compared to the same structure without the AlGaN barrier underneath the GaN channel. The AlGaN layer 102 is built on top of a buffer layer 101 and the buffer layer helps introducing more holes from the p-type GaN. A layer of GaN can serve as the buffer layer 101 and can be mounted on a substrate such as a Sapphire (not shown). A layer 104 of p-doped GaN, (such as Magnesium (Mg) doped GaN) on top of the GaN channel 103 completes the formation of a device that can be used to make a typical GaN transistor. A typical GaN transistor using the structure illustrated in FIG. 1 uses the polarization effect of the back barrier 102 to increase the channel conductivity. Polarization induced hole density is a known phenomenon in the art, as the p-type carriers tend to crowd near the polarized barrier.

To improve the GaN channel conductivity, there are typically two approaches: either increase the carrier density or improve the carrier mobility. The carrier mobility depends the interface roughness, film quality, and other fundamental material properties which are hard to modify. Thus, increasing the carrier density is a more promising approach. The polarization effect in the AlGaN back barrier has a direct effect over the carrier density in the GaN channel. The density increases with increasing the polarization in AlGaN, which can be realized by increasing the percentage of Aluminum in the back barrier.

To provide enough polarization effect, AlGaN with reasonable thickness is required. However, most of the time the AlGaN back barrier is grown on GaN buffer, which has a larger lattice constant compared to AlGaN. This introduces a tensile strain in the AlGaN film. Increasing the percentage of Aluminum leads to larger tensile strain, which eventually results in cracks in the AlGaN film. Thus, the higher the aluminum concentration in the AlGaN, smaller the AlGaN thickness would be, to provide the needed polarization effect. The use of AlGaN as a back barrier is often referred to as analog back barrier alloy.

To overcome this limitation due to lattice mismatch and increased strain as we increase the aluminum concentration in the back barrier, this disclosure proposes a new technology, where the back-barrier layers use digital alloy instead of the analog alloy to improve the channel conductivity while minimizing the stress related to the lattice mismatch.

Super lattices such as comprised of stacked up AlN/GaN (Aluminum nitride/Gallium Nitride) alternating layers are referred to as digital alloys.

Figure 2:
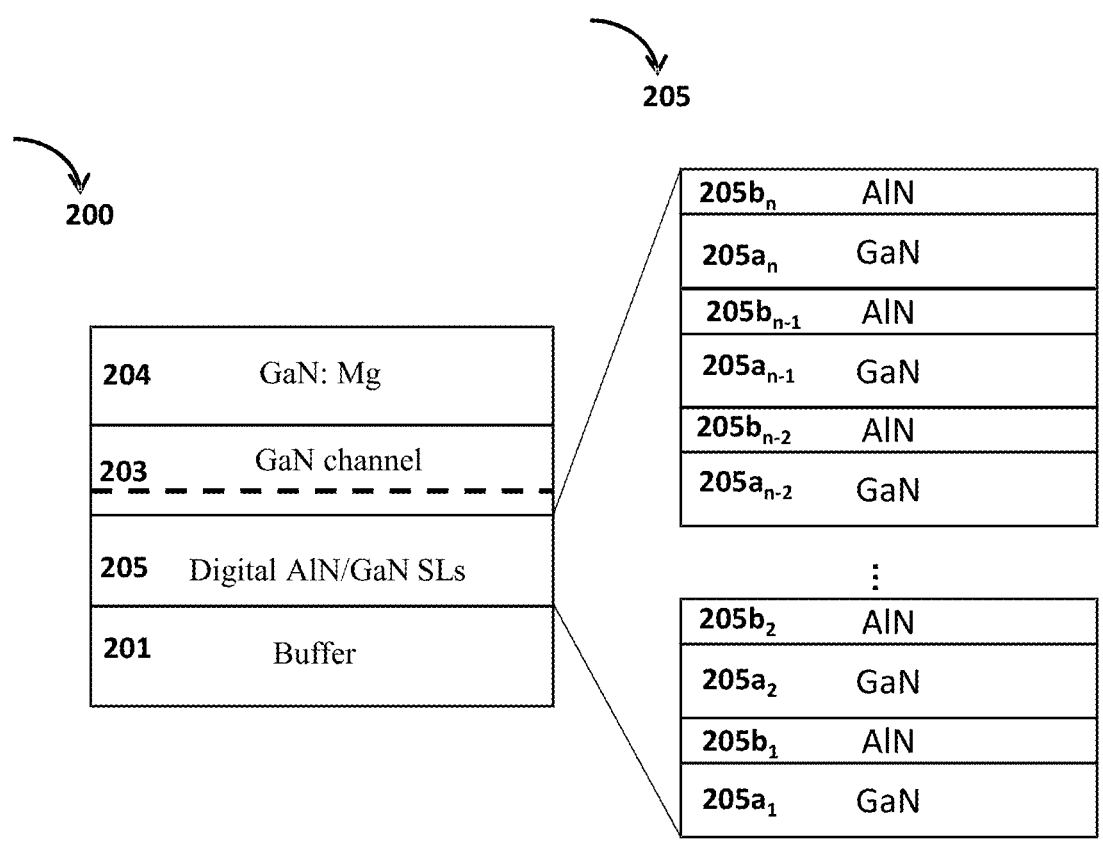
FIG. 2 illustrates a p-channel GaN device containing digital AlN—GaN super lattice structure alloys as the back barrier, according to an embodiment of the present disclosure.

FIG. 2 illustrates a GaN device 200, according to an embodiment of the present disclosure. It uses alternating AlN/GaN layers forming a superlattice structure 205, which is referred to as a digital AlGaN alloy, to serve as the back barrier. Superlattice structures help reduce the cracking issues due to lattice mismatches. At the same time, superlattice structures can provide a polarization effect similar to what the p-type carrier requires to be formed in the GaN channel.

The GaN device 200 comprises of a buffer layer 201, typically about 1.5 micrometer thick and a digital superlattice alloy 205 back barrier mounted over the buffer layer 201. The super lattice back barrier 205 comprises alternating layers of AlN ($205b_{1:n}$) and GaN ($205a_{1:n}$). This structure is also called as binary alloy. Each of the AlN layers ($205b_{1:0}$) are typically about 2 to 3 nanometer thick, while the GaN layers ($205a_{1:n}$) can each be typically 2 to 10 nanometer thick. The superlattice (SL) back barrier 205 typically has more than two; preferably 30 to 40 pairs of alternating AlN and GaN layers. An alternative SL structure is an alternating AlGaN and GaN stack up 205 or AlGaN/AlGaN stack up 205 where the AlGaN layers have different amount Aluminum percentages (by weight or volume).

According to an embodiment of the present disclosure, the superlattice comprises at least three alternating layers of AlN and GaN; each layer having a thickness of less than 10 nanometer.

The GaN channel layer 203 is fabricated over the digital alloy layer 205. In a typical device, the GaN channel layer can be 50 nanometer to 300 nanometer thick. The Magnesium (Mg) doped GaN cap layer 204 serves to supply the holes to the channel and is fabricated on top of the GaN channel 203. The p-doped GaN cap layer 204 is typically about 100 nanometer to 200 nanometer thick. In this embodiment, the cap layer 204 can have much higher Mg doping due to the higher polarization effect of the digital alloy layer 205. The overall total device thickness is typically less than 3 micrometer.

The buffer layer 201 can be GaN or AlGaN. The AlGaN/GaN high-electron-mobility transistor requires a thermally conducting, semi-insulating substrate to achieve the best possible performance. The semi-insulating SiC substrate is currently the best choice for this device technology; however, fringing fields which penetrate the GaN buffer layer at pinch-off introduce significant substrate conduction at modest drain bias if channel electrons are not well confined to the nitride structure. The addition of an insulating buffer on the semi-insulating SiC substrate suppresses this parasitic conduction, which results in dramatic improvements in the AlGaN/GaN transistor performance. A pronounced reduction in both the gate-lag and the gate-leakage current are observed for structures with the buffer layer.

The digital SL alloy back barrier layer 205 provides the necessary polarization effect along the interface with the GaN channel layer 203. Holes crowd along this interface to provide for the necessary channel conductivity. The digital alloy helps providing a thick back barrier with a strong polarization maintained, which helps introduce more holes into the GaN channel layer 203. A transistor made using GaN device 200 was evaluated for performance and found to have substantially higher switching speeds, lower switching loss and a substantially reduced parasitic value.

Figures 3A, 3B, 3C:
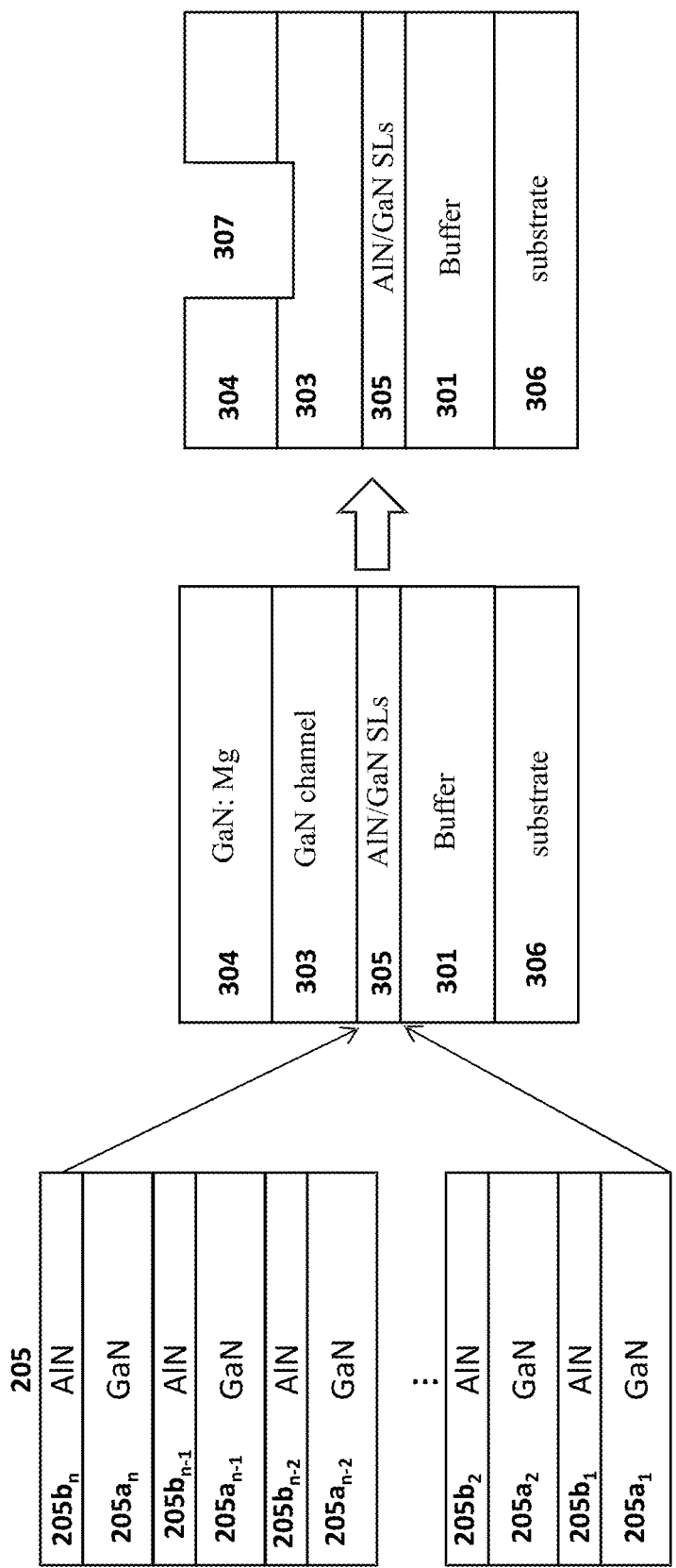
FIGS. 3a, 3b and 3c illustrate the first set of steps involved in the fabrication of a p-channel GaN transistor containing digital AlN—GaN super lattice alloys as the back barrier, according to an embodiment of the present disclosure.

The process of making a transistor using the GaN device 200 can comprise fabricating the layers as structured in FIG. 3b, followed by the process steps illustrated in FIGS. 3c and 4a through 4c. The digital alloy 305 can be fabricated as illustrated in FIG. 3a. The alloy 305 can either be fabricated first or alternatively fabricated as part of fabricating the stack as illustrated in FIG. 3b.

The digital alloy 305 can be formed by stacking up alternative layers of GaN and AlN. A GaN layer is formed using one of many known techniques in the art. One such technique is molecular beam epitaxy (MBE). Alternatively, a GaN layer can also be formed by a sputtering process at a high substrate temperature—for example greater than 700-degree Celsius. Since Gallium is a liquid at around 30-degree Celsius, initial nitridation of Gallium liquid metal surface needs to be done in this sputtering process using pure Ga as target surface. A horizontal water cooled stainless steel trough can be used for the growth of GaN epilayer. A reactive Direct Current (DC) magnetron sputter epitaxy can be used. In fabricating the digital alloy 305, a GaN layer is first formed to the required thickness of between 2 nanometer to 10 nanometer, followed by an AlN (Aluminum Nitride) layer formed on top of this GaN layer by several known techniques, such as sputtering, electroplating or MBE. Typically, a 2 nanometer to 3 nanometer thick AlN layer is formed. The process is repeated for subsequent pair of GaN and AlN layers. It is not unusual to form 30 to 40 pairs of GaN/AlN layers by repeating this process, yielding a digital alloy that is less than 3 micrometer thick.

The process of making the device 200 comprises forming a buffer layer 301 on a substrate 306 of choice, such as Silicon Carbide (SiC) or Saphire, as illustrated in FIG. 3b. The buffer layer 301 can be any suitable material, such as GaN or AlGaN. The buffer layer is typically about 1 to 2 micrometer thick and preferably 1.5 micrometer thick. The digital alloy 305 is formed on top of this buffer layer as described earlier. Alternatively, the digital alloy can be fabricated separately and deposited on top of the buffer layer by any known techniques such as MBE or a sputtering process. Typically, the digital alloy will be between 1 to 2 micrometer thick and preferably about 1.5 micrometer thick. The GaN channel is fabricated on top of the digital alloy using techniques described earlier. The GaN channel is typically between 50 nanometer to 300 nanometer thick, and preferably 100 nanometer thick. The p-doped GaN layer is formed on top of the GaN channel by any known process, such as MBE or sputtering. In a preferred embodiment, Magnesium (Mg) is used as the p-dopant.

The next step in the process is to etch a gate recess 307 that exposes the GaN channel 303 as illustrated in FIG. 3c. This etching process typically comprises masking the area around and exposing the etching area and using known etching techniques (such as using chemical or gas or laser/molecular beams) to etch out the gate area and exposing a part of the GaN channel 303. Next, a suitable gate dielectric 408 such as Silicon dioxide is deposited as illustrated in FIG. 4a by any known techniques, such as depositing Silicon by sputtering followed by oxidation or any other suitable technique depending on the chosen gate dielectric.

FIG. 4b illustrates the next step of forming the ohmic contacts 409a and 409b on the p-channel. This step comprises of depositing the contact electrode of the device, such as gold, copper or silver and is typically done using electroplating or sputtering process. The final step is to form the gate metal in the cavity of the dielectric as illustrated in FIG. 4c. The gate metal can be gold, silver or copper or any other suitable gate material. Depending on the chosen gate material, process such as electroplating or sputtering can be used.

The surfaces can be polished, cleaned and separated from the substrate to form the device 200.

In the process steps described above, any of the steps illustrated can be changed, modified or eliminated to better suit the materials chosen or as known to one in the art. Additional steps may be added as needed to perfect the device fabrication per specification.

Several test fabrications and characterization of the proposed technology were carried out to characterize and quantify the benefits of the proposed technology. Since the density of hole along the channel is one of the prime factor deciding the power handling capacity of the device, the tests measure current flow as a function of applied voltage for various device structures. FIGS. 5a-5d and FIGS. 6a-6d illustrate the results of this study. The structures are illustrated on the left (FIGS. 5a, 5c, 6a and 6c) while the performance characteristics of the respective structures are illustrated on the right (FIGS. 5b, 5d, 6b and 6d).

Figures 5A, 5B:
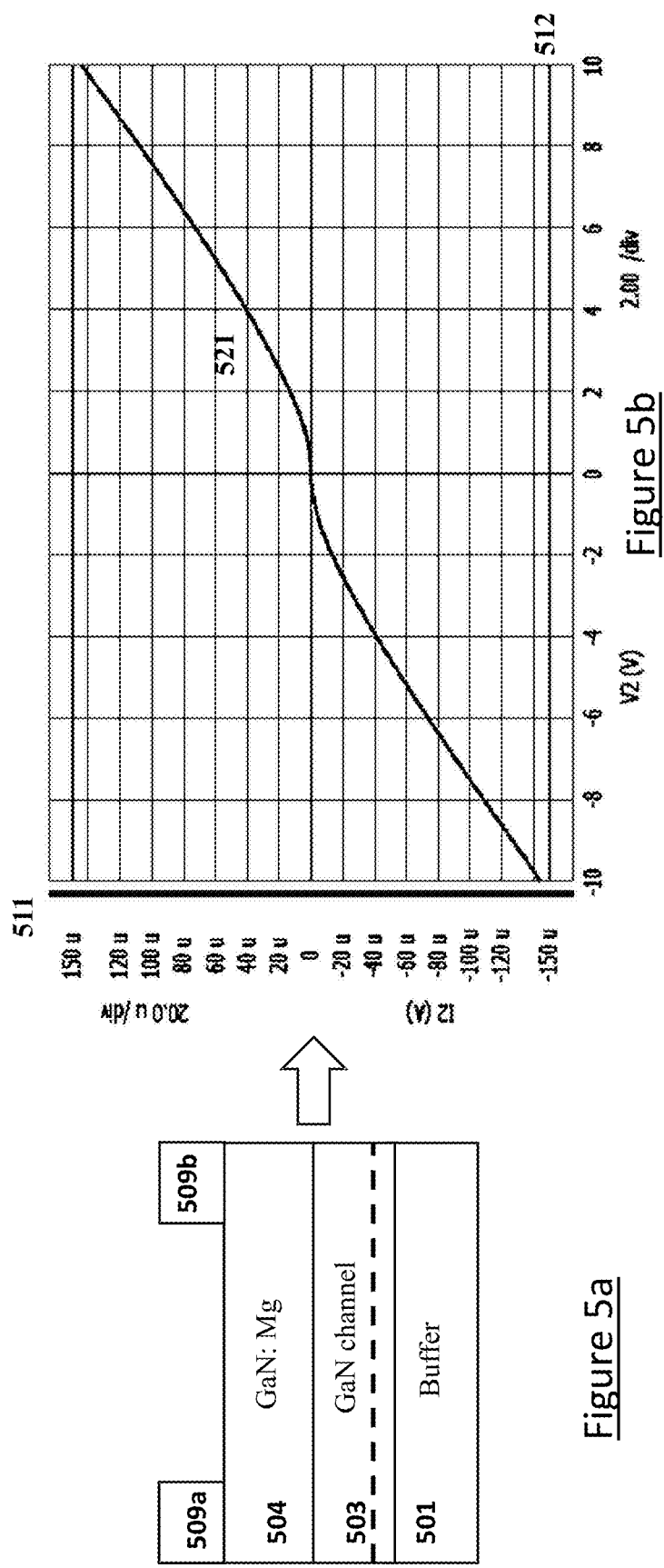

FIG. 5a illustrates a GaN transistor structure having an epi structure without the back barrier. It comprises of the Buffer layer 501 and having a GaN channel 503 on top. The p-doped GaN layer 504 using Mg as the dopant is deposited on top of the GaN channel 503. The ohmic contacts 509a and 509b is used to apply a voltage to the device and current through the structure is measured. On the right is the measured performance characteristics of this structure as shown in FIG. 5b. The X-axis 512 is the voltage applied in Volts between the ohmic contacts 509a and 509b. The Y-axis 511 is the measured current through the device in μ amps. It can be noted that as the voltage is varied between −10 v to +10 v, the current through the device as shown by the curve 521 linearly increases between −150μ amps to +150μ amps. This baseline performance can be compared with the performance of the subsequent improvements in the device structure.

Figures 5C, 5D:
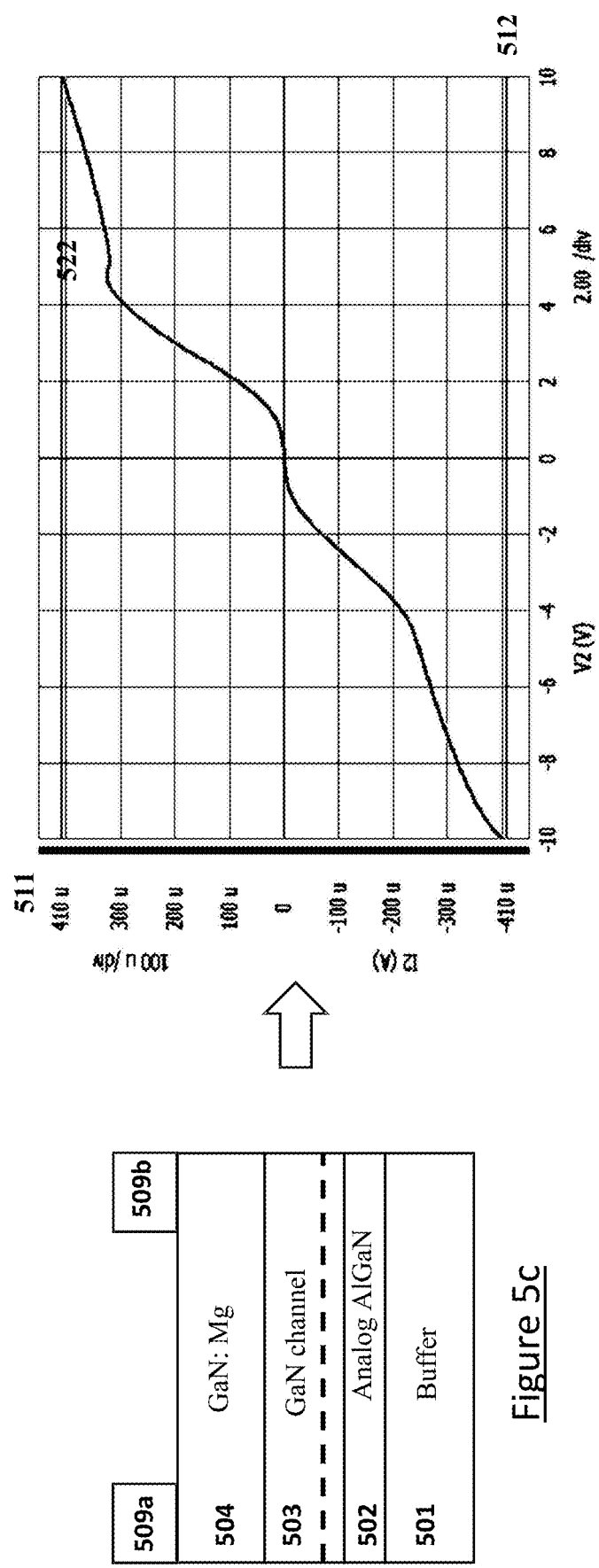
FIG. 5c illustrates a p-channel GaN transistor structure according to an embodiment of the present disclosure.
FIG. 5d illustrates the channel conductivity characteristics for the p-channel GaN transistor structure illustrated in FIG. 5c.

FIG. 5c illustrates a revised device structure where an analog alloy 502 is added to the device. This analog alloy 502 creates the polarization effect along the GaN channel boundary causing hole crowding and increased current flow. FIG. 5d illustrates the performance of this structure in FIG. 5c. For the same range of applied voltage (−10 v to +10 v), the current increases to −410μ amps to +410μ amps as shown by the performance curve 522. This is almost a threefold increase in the device conductivity, primarily caused by the introduction of the analog alloy 502.

Figure 6B:
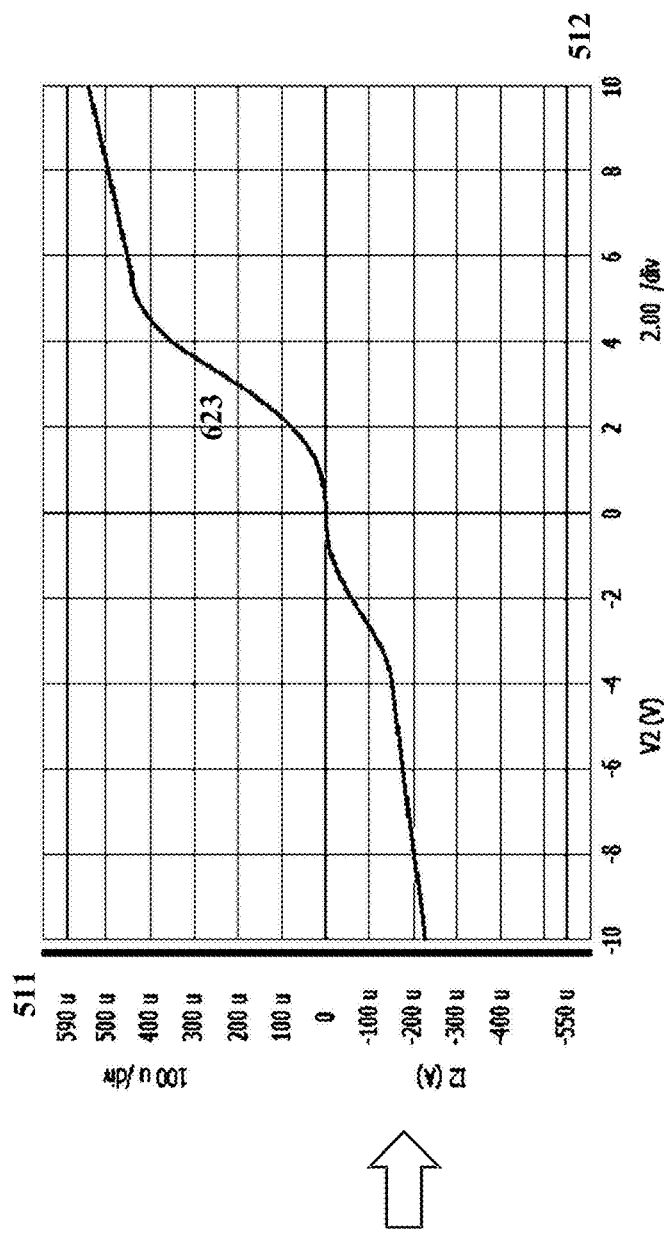
Figure 6A:
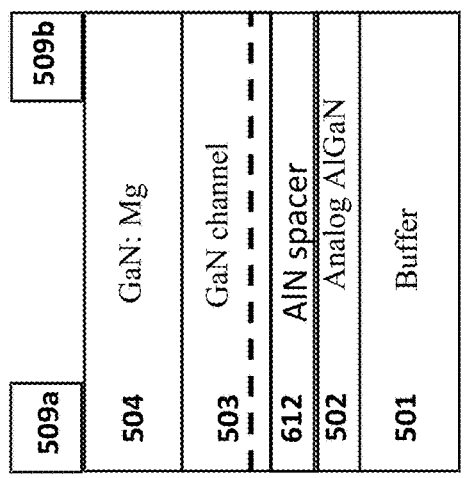
FIG. 6a illustrates a p-channel GaN transistor structure according to an embodiment of the present disclosure.

Next, we compare the performance of having a AlN spacer 612, which is primarily introduced between the GaN channel 503 and the AlGaN layer 502 as illustrated in FIG. 6a, to mitigate the stress due to the lattice mismatch. This spacer 612 marginally increases the current flow as shown by the curve 623 to about −580μ amps to +580μ amps as the applied voltage between the ohmic contacts is varied in the same range of −10 v to +10 v. The structure in FIG. 6a has a marginally better performance 623 in FIG. 6b compared with the performance curves 521 and 522. The spacer 612 also helps mitigate the stress due to lattice mismatch between the GaN layer 503 and the analog alloy 502.

Figures 6C, 6D:
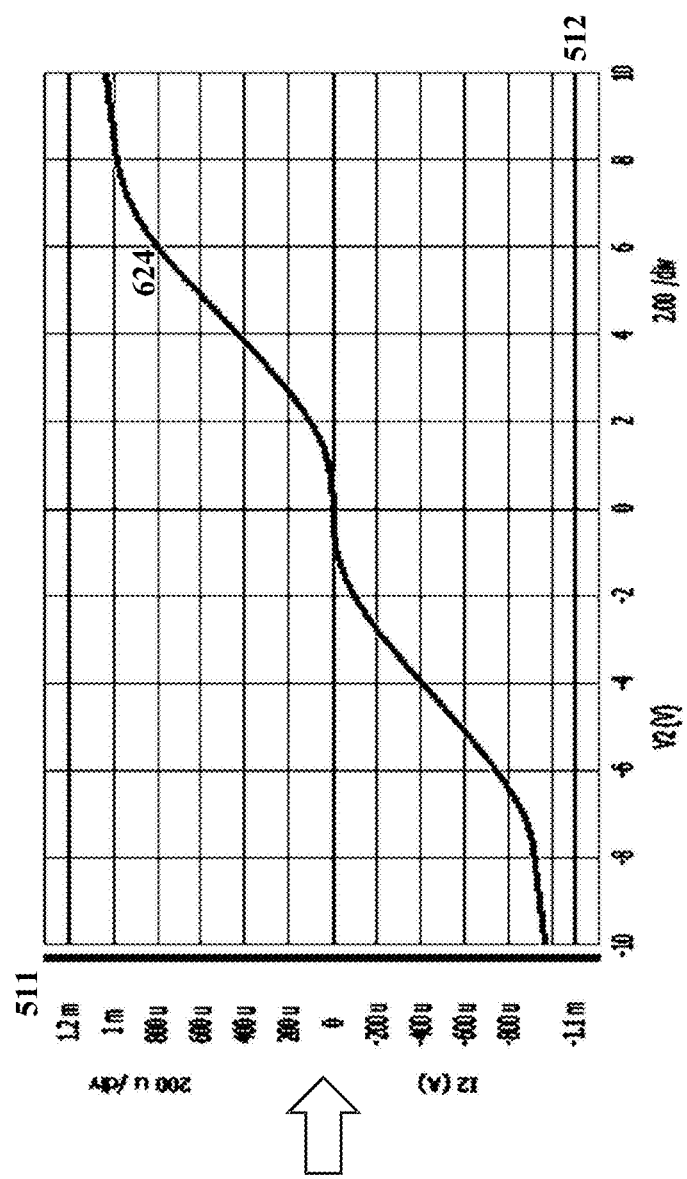
FIG. 6c illustrates a p-channel GaN transistor structure according to an embodiment of the present disclosure.
FIG. 6d illustrates the channel conductivity characteristics for the p-channel GaN transistor structure illustrated in FIG. 6c.

Finally, we illustrate the substantial performance improvement of the proposed technology. FIG. 6c illustrates the digital alloy layer 605 replacing the analog alloy 502, located between the Buffer layer 501 and the GaN channel 503. The corresponding performance curve 624 in FIG. 6d shows the current through the device in the range of −1.0 milliamps to +1.0 milliamps as the applied voltage is varied between the same voltage range of −10 v to +10 v, as shown by FIG. 6d. This is almost a 3× performance in device conductivity compared to the analog alloy performance 522 in FIG. 5d. One can titrate the thickness of the digital alloy 605 and/or the material and/or individual alloy material thicknesses of the alloy compositions to increase the conductivity further, while mitigating the stress due to lattice mismatch between the GaN channel 503 and the digital alloy layer 605.

In particular configurations, it may be desirable to have the AlN/GaN alloy to create the polarization effect to enhance hole crowding. In other configurations, one can use AlGaN/GaN alloy to create the polarization effect. The device stack up can be varied to suit the intended applications. Thickness of each layers as well as the digital alloy thickness can be varied to meet particular performance needs. Though this disclosure describes the technology using GaN, the proposed technology applies to any of the III-Nitride semiconductor materials (Al, In, Ga)N or the combinations thereof.

Modifications, additions, or omissions may be made to the systems, apparatuses, and methods described herein without departing from the scope of the inventive concepts. The components of the systems and apparatuses may be integrated or separated. Moreover, the operations of the systems and apparatuses may be performed by more, fewer, or other components. The methods may include more, fewer, or other steps. Additionally, steps may be performed in any suitable order. As used in this document, "each" refers to each member of a set or each member of a subset of a set.

To aid the Patent Office, and any readers of any patent issued on this application in interpreting the claims appended hereto, applicants wish to note that they do not intend any of the appended claims or claim elements to invoke paragraph 6 of 35 U.S.C. Section 112 as it exists on the date of filing hereof unless the words "means for" or "step for" are explicitly used in the particular claim.

What is claimed is:

1. A power handling device comprising:
a III-nitride channel layer, wherein the III-nitride channel layer comprises a p-channel;
a III-nitride cap layer directly on the channel layer, wherein the cap layer has a higher level of p-type doping than the channel layer;
a III-nitride digital alloy back barrier below the channel layer;
wherein the III-nitride digital alloy back barrier comprises a superlattice structure.

2. The power handling device of claim 1, further comprising a buffer layer below the digital alloy back barrier layer.

3. The power handling device of claim 2 wherein:
the buffer layer comprises GaN or AlGaN; and
the buffer layer has a thickness of 1 to 2 micrometers.

4. The power handling device of claim 1, wherein the III-nitride channel layer is a Gallium Nitride (GaN) channel layer.

5. The power handling device of claim 1, wherein the cap layer is a Magnesium (Mg) doped GaN.

6. The power handling device of claim 1, wherein the digital alloy back barrier is a binary alloy.

7. The power handling device of claim 1, wherein the superlattice structure comprises alternating Aluminum Nitride (AlN) and GaN layers.

8. The power handling device of claim 1, wherein the superlattice structure comprises ternary alloys.

9. The power handling device of claim 1, wherein the superlattice structure comprises alternating GaN and Aluminum-Gallium-Nitride (AlGaN) layers.

10. The power handling device of claim 1, wherein the superlattice structure comprises alternating AlGaN and AlGaN layers with different Aluminum percentages.

11. The power handling device of claim 1, wherein the digital alloy is designed to mitigate strain due to lattice mismatch between the channel layer and the digital alloy back barrier layer.

12. The power handling device of claim 1:
wherein the superlattice structure comprises 30 to 40 superlattice layers, wherein each superlattice layer comprises an Aluminum Nitride (AlN) layer on a GaN layer.

13. The power handling device of claim 12:
wherein each GaN layer has a thickness of 2 to 10 nanometers; and
wherein each Aluminum Nitride (AlN) layer has a thickness of 2 to 3 nanometers.

14. The power handling device of claim 1 wherein:
the III-nitride channel layer has a thickness of 50 to 300 nanometers; and
the III-nitride cap layer has a thickness of 100 to 200 nanometers.

15. A P-channel III-nitride transistor comprising:
a III-nitride channel layer, wherein the III-nitride channel layer comprises a p-channel;
a III-nitride cap layer directly on the channel layer, wherein the cap layer a has a higher level of p-type doping than the channel layer;
a III-nitride digital alloy back barrier below the channel layer;
wherein the III-nitride digital alloy back barrier comprises a superlattice structure.

* * * * *